US006838739B2

(12) United States Patent
Stelzl et al.

(10) Patent No.: US 6,838,739 B2
(45) Date of Patent: Jan. 4, 2005

(54) COMPONENT WITH A LABEL

(75) Inventors: Alois Stelzl, München (DE); Hans Krüger, München (DE); Ernst Christi, Vilsbiburg (DE)

(73) Assignee: Epcos AG, München (DE)

( * ) Notice: Subject to any disclaimer, the term of this patent is extended or adjusted under 35 U.S.C. 154(b) by 137 days.

(21) Appl. No.: 10/240,872

(22) PCT Filed: Mar. 5, 2001

(86) PCT No.: PCT/DE01/00833

§ 371 (c)(1),
(2), (4) Date: Oct. 4, 2002

(87) PCT Pub. No.: WO01/78041

PCT Pub. Date: Oct. 18, 2001

(65) Prior Publication Data

US 2003/0047806 A1 Mar. 13, 2003

(51) Int. Cl.⁷ .......................... H01L 29/82; H01L 27/14; H01L 31/0232
(52) U.S. Cl. ................. 257/416; 257/415; 257/431; 257/432; 257/437; 257/660
(58) Field of Search ............... 438/7, 15, 16, 438/29, 54, 55, 124, 127, 636, 632, 662; 257/414–416, 431, 437, 659, 660, 728, 432

(56) References Cited

U.S. PATENT DOCUMENTS 6,143,587 A   11/2000 Omizo ................. 438/106
6,242,842 B1 *  6/2001 Pahl et al.

FOREIGN PATENT DOCUMENTS

DE          39 39 575        6/1991

OTHER PUBLICATIONS

Abstract of Published Japanese Application 06–142952 (May 24, 1994) *Patent Abstracts of Japan*, vol. 018, No. 449 (U–1660), Aug. 22, 1994.

Abstract of Published Japanese Application 11–156565 (Jun. 15, 1999), *Patent Abstracts of Japan*, vol. 1999, No. 11, Sep. 30, 1999.

* cited by examiner

*Primary Examiner*—Ha Tran Nguyen
(74) *Attorney, Agent, or Firm*—Schiff Hardin & Waite

(57) ABSTRACT

For labeling a component provided with a metallic cover layer, it is proposed that at least one additional contrast layer is arranged over the cover layer. The contrast layer produces an optical contrast with the metallic cover layer and is capable of being eroded by a laser for producing a label.

13 Claims, 1 Drawing Sheet

COMPONENT WITH A LABEL

BACKGROUND OF THE INVENTION

The invention is directed to a component, particularly to a miniaturized, passive component.

For identifying electrical, electronic and, in particular, passive components, these are usually provided with a label. This can provide information about the manufacturer, the type or the specifications of the component and, potentially, the serial number or article designation. Larger components that comprise adequately large surfaces for the acceptance of a label can, for example, be printed with silkscreening in a simple way. Given smaller components having dimensions of, for example, below 1 mm, enough printable surface for producing a label is not available. Alternatively, these components can be labeled with a laser beam that still enables even the minutest font sizes to be produced.

Only labels that are difficult to read or no labels at all can be generated with laser labeling on miniaturized components that comprise a metallic layer on the surfaces available for a label since adequate contrast cannot be achieved there by erosion of material.

SUMMARY OF THE INVENTION

It is therefore an object of the present invention to specify a component with, in particular, a metallic cover layer on which a high-contrast labeling is possible.

This object is inventively achieved by a component that comprises a metallic layer, particularly a cover layer, on a surface available for labeling, it is proposed that a contrast layer that can be eroded with a laser is applied over the metallic layer. In this way, one succeeds in fashioning a highly legible label with high optical contrast in a simple way in the contrast layer by means of laser labeling, i.e. by means of partial layer erosion.

All layers that are simply to apply and that comprise a good optical contrast relative to the metallic cover layer fundamentally come into consideration for the contrast layer. Particularly simple to apply are those contrast layers that are compatible with the manufacturing steps of the component. Those contrast layers are especially preferred whose application can be seamlessly introduced into the manufacturing process of the component and that, in particular, can use the same apparatus which is required for preceding method steps in the manufacture of the component.

In an advantageous development of the invention, the contrast layer is generated immediately after the manufacture of the metallic cover layer, and the contrast layer is also preferably a metallic layer that differs from the metallic cover layer with respect to its optical properties. A distinction between two metallic layers can, for example, be achieved via the reflection behavior of the metallic layers that, in particular, is dependent on the modification or, respectively, fine structure of the layer. Alternatively or additionally, the contrast layer can differ from the cover layer in color or, respectively, differently colored metals can be employed for the layers.

However, other materials can be selected for the contrast layer, for example lacquer layers and, in particular, colored lacquer layers, especially black lacquer layers. In general, it is advantageous when the contrast layer exhibits a different color compared to the metal layer or, in particular, is a black layer.

Purely metallic layer combinations generated on top of one another wherein a good optical contrast can be generated by laser labeling and that can be serially applied and, in particular, with the same apparatus or a similar apparatus are, for example:

a) copper/bright nickel/black nickel,
b) bright copper/nickel/black nickel,
c) copper/nickel (matte)/nickel (gray), or
d) copper/aluminum/anodized aluminum.

These layer combinations can be additionally applied over the metallic cover layer. One or two metal layers of the layer sequences, however, can also form the cover layer or co-assume the functional tasks of the cover layer.

Preferred layer combinations are those that comprise two different modifications of one and the same metal. In particular, these are produced by means of different manufacturing conditions. Given application of the metallic layers by sputtering, currentless deposition or galvanic deposition, for example, the composition or the corresponding optical layer properties can be set by varying the method parameters or deposition conditions.

The following metal/metal combinations, which are also distinguished by different metal coloration, are layer sequences that can be serially applied and comprise a metal layer (cover layer, too), that develop an optical contrast relative to one another and that can be labeled or, respectively, eroded with a laser, for example:

e) nickel/gold,
f) copper/nickel,
g) copper/aluminum,
h) copper/tin, or
i) copper/silver.

The same deposition conditions are preferred for these differently colored metal layer combinations, whereof at least the lower layer can be the metallic cover layer or part of the metallic cover layer. Even though the contrast is produced here merely by means of differently colored metal layers or, respectively, the metal layer regions remaining after the laser labeling, a contrast in reflection can also be produced in addition to the contrast in color. It is thereby preferred when the upper layer (contrast layer) has poor reflectivity, but the lower layer that can be uncovered by laser labeling comprises good reflective properties.

An electrophoretic process is also suitable for applying a contrast layer composed of a lacquer and, in particular, of a black lacquer. A number of different lacquers are suitable for this contrast layer and no or few demands other than the contrast have to be made of the lacquer's material or, respectively, composition. However, it is also possible to print the contrast layer comprising a lacquer on, to dribble it on or to cast it on the cover layer.

The invention encounters advantageous application in components that comprise or require a metallic cover layer as a functional layer. For example, such a metallic cover layer can be a metallic cap. However, the metallic cover layer can also be a metallic housing or a part thereof in which an arbitrary component is arranged. Metallic cover layers are also particularly employed as shielding layers against electromagnetic radiation. Such a shielding can be required in order to prevent the emission of electromagnetic radiation from the component itself. However, a component is also possible that comprises a metallic cover layer that serves the purpose of shielding against electromagnetic radiation acting from the outside, particularly when the component is sensitive to the electromagnetic radiation. The components are therefore preferably components operated at high-frequency, particularly surface-wave components for the RF range.

The invention is explained in greater detail below on the basis of an exemplary embodiment and the two Figures appertaining thereto.

DESCRIPTION OF THE PREFERRED EMBODIMENTS

Figure 1:
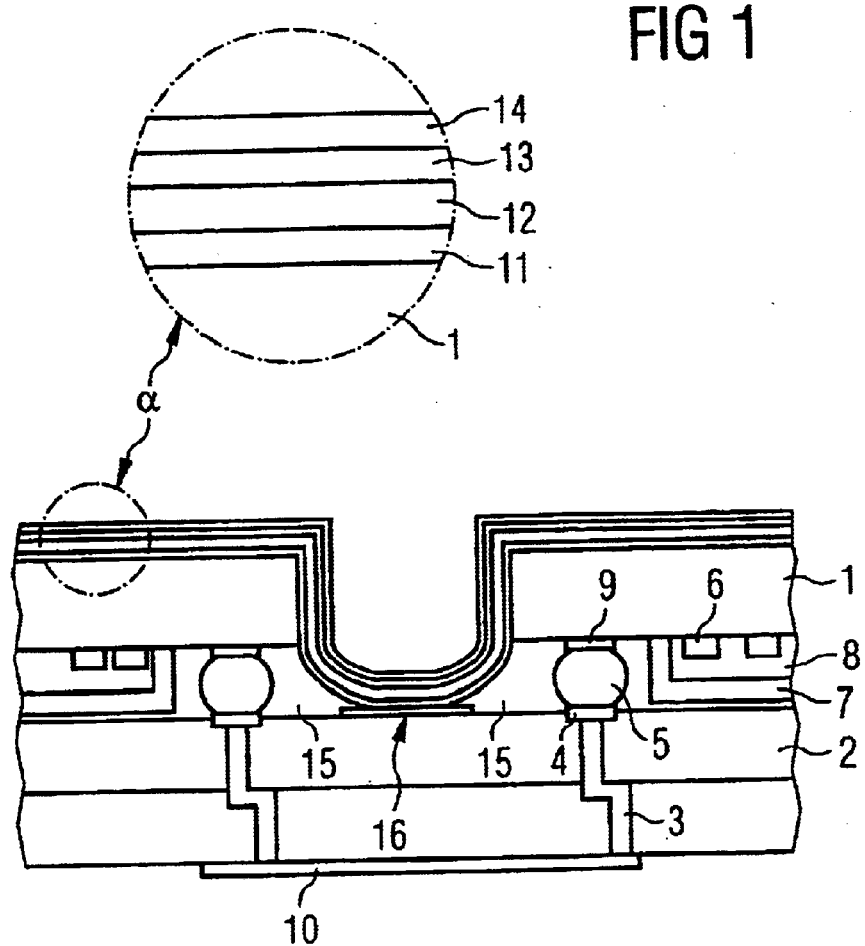
FIG. 1 shows a schematic cross-sectional view of components applied on a carrier with a multi-layer metallization.

A preferred application of the invention is for surface-wave components, particularly surface-wave filters that are applied on base panels or substrates 2 in flip-chip technology. The piezoelectric component substrate or chip 1 that carries the active component structure 6 is thereby connected face-down to the panel 2 via suitable solder connections 5, particularly via bumps, so that the component structures are arranged protected between component substrate 1 and panel 2 at a clear distance from the latter. Preferably, a plurality of components are thereby applied on one panel and only separated after the completion of all cover layers. As shown, the active component structures 6 can also be additionally covered with a cover cap 7 that is generated directly on the surface of the component substrate 1 (chip) in an integrated process called PROTEC by the assignee. This leaves a clear cavity 8 over the component structures 6 that mechanically protects it during the process.

The bumps 5 connect the terminal pads 9 on the chip 1, which pads 9 are electrically conductively connected to the active component structures 6, to the under-bump metallization 4 on the base 2. An electrically conductive connection from the metallizations 4 to the terminal metallizations 10 on the underside of the panel 2 is produced via through-contactings 3 in the panel and the assistance thereof makes it possible to connect the component to, for example, a circuit in SMD structure that is produced on a printed circuit board or a module. The panel 2 is fashioned of plastic or ceramic and is preferably two-layer. This creates a metallization level between the layers, so that interconnects can be laid without intersecting. Moreover, this allows through-contactings 3 that are laterally offset relative to one another, and these through-contactings are capable of being manufactured hermetically tight in contrast to through-contactings that lead through the panel 2 on a straight line.

For shielding from electromagnetic radiation, a metallic layer that comprises a plurality of layers, such as 11, 12, 13, 14, is applied on the back side of the component substrate so that it terminates hermetically tight relative to the panel 2 and thus hermetically seals the entire component. To this end, an underfiller 15 can be applied as a seal in a previous step, and the under-filler 15 annularly surrounds the component substrate 1 and closes the clearance between the component substrate 1 and panel 2 at at least in the outer region of the component substrate (see FIG. 1). The under-filler 15 can be produced by applying and curing a liquid sealing compound, particularly a lacquer or resin. For sealing, however, it is also possible to apply a plastic film, metal foil or laminate foil (not shown in the Figure) that lies tightly against the component and the base substrate.

The metallic cover layer can now be applied on the component substrate or, potentially, on the seal by means of a foil. For example, this can ensue in the form of a metallic foil. However, the metallic layer can also be the outer layer of a multi-layer laminate foil that is utilized for sealing the component. It is also possible, however, to produce the metallic cover layer by metallization and subsequent galvanic reinforcement. This has the advantage that the contrast layer can be generated in the same way immediately thereafter, preferably as an additional metallic layer.

To that end, the surface to be metallized (back side of the chip 1, surface of the under-filler 15 and exposed surface of the panel 2 next to the applied chip 1) is first activated, for example with $PdCl_2$ solution at a slightly elevated temperature. As a first layer, a chemical metallization is then deposited currentless on the surface activated in this way, for example an approximately 2–3 μm thick copper layer 11 in a highly alkaline, chemical copper bath.

The copper layer 11 is subsequently galvanically reinforced, for example with an additional copper layer 12 in an acidic copper bath at room temperature. As a passivation layer, a nickel layer 13 is now deposited over the layer 12 by an acidic matte nickel bath, and this represents a partial layer for the contrast of the later labeling. As a contrast layer belonging thereto, an approximately 0.3 μm thin black nickel-plating is then produced by an acidic black nickel bath on the layer 13.

Figure 2:
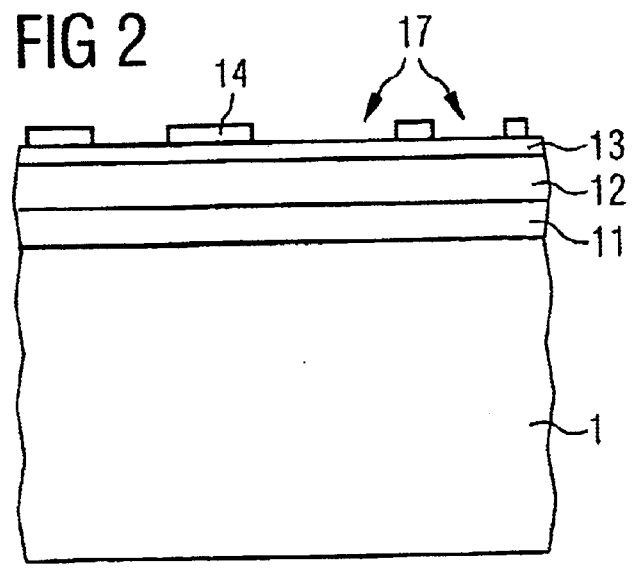
FIG. 2 shows a schematic cross-sectional view of a label produced in the multi-layer metallization.

By means of a selective exposure with a laser beam, for example a beam from an NdYAG laser, a part of the contrast layer 14 is now selectively removed, as shown in FIG. 2, and this is promoted by the high absorption of the dark, black nickel layer. The surface of the metallically bright nickel layer 13 now appears in the regions uncovered in this way and forms a highly visible contrast together with the remaining layer regions of the black nickel layer 14.

As stated above, the invention is advantageously utilized given components surface acoustical wave (SAW) that are applied and enveloped according to the method called CSSP (Chip Sized SAW Package) by the assignee. In contrast to a traditional technique, the component substrate 1 applied on a panel 2 by means of flip-chip technology comprises essentially the same dimensions as the panel 2 and therefore enables a further miniaturization of the component or, respectively, of the component package. A plurality of components applied in common on a panel 2 and inventively covered are subsequently separated, for example by sawing at a parting location 16 between the soldered-on component substrates (see FIG. 1).

Of course, the invention is not limited to the employment given SAW components. However, it is preferably employed for miniaturized components that do not enable a traditional labeling by means of printing because of the small available surface and wherein a direct laser labeling is not possible due to the metallic cover layer or can only be produced with poor contrast.

We claim:

1. A component having a metallic cover layer, a contrast layer being arranged on the cover layer, said contrast layer providing an optical contrast with the metallic cover layer and being eroded by a laser beam for producing a label on the cover layer, said label being formed by portions of the contrast layer being removed to uncover the cover layer, said component being a surface acoustical wave (SAW) component with the cover layer providing RF-shielding, said component being secured on a panel by a flip-chip technique and the cover layer being applied on a back side of the component and hermetically seals the component to the panel.

2. A component according to claim 1, wherein the optical contrast is achieved by one of the cover layer and the contrast layer being a reflective layer and the other of the cover layer and the contrast layer being a matte layer.

3. A component according to claim 1, wherein the optical contrast is achieved by the cover layer and the contrast layer being of different colors.

4. A component according to claim 1, wherein the contrast layer is a black layer and the cover layer is a metallically bright layer.

5. A component according to claim 1, wherein the contrast layer is a black nickel layer.

6. A component according to claim 1, wherein a combination of the cover layer and the contrast layer is selected from one of the following material combinations: Ni/Au; Cu/Ni; Cu/Al; Cu/Sn; Cu/Au.

7. A method for manufacturing a labelable component, comprising the steps of: applying a first layer on the component; applying a second layer on the first layer immediately after the application of the first layer, then applying a third layer on the second layer to form a layer combination selected from the following combinations:

copper/bright nickel/black nickel, bright copper/nickel/black nickel;

copper/nickel (matte)/nickel (gray), and copper aluminum/anodized aluminum, at least one of the layers of each combination being a metallic cover layer and at least one layer of each combination being a metallic contrast layer on the cover layer, while selecting one of the materials of the contrast layer and the conditions of applying the contrast layer so that the contrast layer and the cover layer have different optical properties.

8. A method according to claim 7, wherein the step of applying the contrast layer utilizes an apparatus used for applying the cover layer.

9. A method according to claim 7, wherein the applying of the cover layer and the applying of the contrast layer are selected from currentless deposition and galvanic deposition.

10. A method according to claim 7, wherein the applying of the at least one layer is by sputtering.

11. A method according to claim 7, wherein the applying of the cover layer and the contrast layer is selected from currentless deposition, galvanic deposition and sputtering and different optical properties of the layers are obtained by variations in one of the process parameters and deposition conditions.

12. A method according to claim 7, wherein the steps of applying are selected from currentless deposition, galvanic deposition and sputtering and wherein different compositions of the cover layer and contrast layer are achieved by variations in process parameters and deposition conditions.

13. A method according to claim 7, which includes subsequently applying a laser beam to lift off portions of the contrast layer to form a label.

* * * * *